United States Patent
Wright et al.

(10) Patent No.: US 8,164,365 B2
(45) Date of Patent: Apr. 24, 2012

(54) NON-RESISTIVE LOAD DRIVER

(75) Inventors: David Wright, San Diego, CA (US);
Jason Muriby, San Diego, CA (US);
Erhan Hancioglu, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 483 days.

(21) Appl. No.: 11/843,216

(22) Filed: Aug. 22, 2007

(65) Prior Publication Data
US 2008/0258797 A1  Oct. 23, 2008

Related U.S. Application Data

(60) Provisional application No. 60/912,577, filed on Apr. 18, 2007.

(51) Int. Cl.
*H03B 1/00*  (2006.01)
(52) U.S. Cl. .......... 327/108; 327/112; 327/170
(58) Field of Classification Search .......... 327/108–112, 327/170; 326/26, 27, 82, 83, 87
See application file for complete search history.

(56) References Cited

U.S. PATENT DOCUMENTS

| 4,061,987 | A | * | 12/1977 | Nagahama |
| 4,242,604 | A |   | 12/1980 | Smith |
| 4,272,760 | A | * | 6/1981  | Prazak et al. |
| 4,344,067 | A | * | 8/1982  | Lee |
| 4,684,824 | A |   | 8/1987  | Moberg |
| 4,689,581 | A |   | 8/1987  | Talbot |
| 4,689,740 | A |   | 8/1987  | Moelands et al. |
| 4,692,718 | A | * | 9/1987  | Roza et al. |

(Continued)

FOREIGN PATENT DOCUMENTS

EP  1625506 A1  2/2006

(Continued)

OTHER PUBLICATIONS

S.K. Kim, Y.-S. Son and G.H. Cho, Low-power high-slew rate CMOS buffer amplifier for flat panel display drivers, Electronics Letters, Feb. 16, 2006, vol. 42 No. 4 Fhttp://circuit.kaist.ac.kr/upload_files/paper/Low-Power%20high-slew-rate%20CMOS%20buffer%20amplifier%20for%20flat%20panel%20display%20drivers.pdf.

(Continued)

*Primary Examiner* — Long Nguyen

(57) ABSTRACT

Embodiments of the invention relate to a method and apparatus to drive non-resistive loads. The non-resistive load driver may include two or more drivers, such as a high-drive circuit and a low-drive circuit, to drive rail-to-rail output voltages and to stabilize the output voltages at a substantially constant level. The high-drive circuit may drive the output voltage of the non-resistive load driver to a threshold level, whereas the low-drive circuit may modify the output voltage of the non-resistive load driver to approximate an input voltage of the non-resistive load driver, and compensate any leakage associated with the non-resistive loads to provide a substantially constant output voltage. The low-drive circuit consumes less current than the high-drive circuit. The non-resistive load driver consumes less power and use less chip space. Alternatively, the non-resistive load driver may be implemented using a single driver with multiple modes, such as a low-drive mode and a high-drive mode, by changing a bias current of the non-resistive load driver between a high current mode and a low current mode.

20 Claims, 3 Drawing Sheets

U.S. PATENT DOCUMENTS

| | | | |
|---|---|---|---|
| 4,692,760 A | | 9/1987 | Unno et al. |
| 4,736,123 A | | 4/1988 | Miyazawa et al. |
| 4,797,580 A | | 1/1989 | Sunter |
| 4,839,636 A | | 6/1989 | Zeiss |
| 4,855,683 A | | 8/1989 | Troudet et al. |
| 4,868,525 A | * | 9/1989 | Dias |
| 4,882,549 A | | 11/1989 | Galani et al. |
| 4,947,169 A | * | 8/1990 | Smith et al. |
| 4,980,653 A | | 12/1990 | Shepherd |
| 4,988,983 A | | 1/1991 | Wehrer |
| 5,019,729 A | | 5/1991 | Kimura et al. |
| 5,036,300 A | | 7/1991 | Nicolai |
| 5,073,757 A | | 12/1991 | George |
| 5,095,280 A | | 3/1992 | Wunner et al. |
| 5,111,081 A | | 5/1992 | Atallah |
| 5,140,197 A | * | 8/1992 | Grider |
| 5,142,247 A | | 8/1992 | Lada, Jr. et al. |
| 5,144,254 A | | 9/1992 | Wilke |
| 5,150,079 A | | 9/1992 | Williams et al. |
| 5,175,884 A | | 12/1992 | Suarez |
| 5,200,751 A | | 4/1993 | Smith |
| 5,268,599 A | | 12/1993 | Matsui |
| 5,289,138 A | | 2/1994 | Wang |
| 5,304,955 A | | 4/1994 | Atriss et al. |
| 5,319,370 A | | 6/1994 | Signore et al. |
| 5,321,319 A | | 6/1994 | Mahmood |
| 5,345,195 A | | 9/1994 | Cordoba et al. |
| 5,349,544 A | | 9/1994 | Wright et al. |
| 5,355,033 A | | 10/1994 | Jang |
| 5,381,116 A | | 1/1995 | Nuckolls et al. |
| 5,408,191 A | | 4/1995 | Han et al. |
| 5,420,543 A | | 5/1995 | Lundberg et al. |
| 5,428,319 A | | 6/1995 | Marvin et al. |
| 5,432,665 A | | 7/1995 | Hopkins |
| 5,440,305 A | | 8/1995 | Signore et al. |
| 5,446,867 A | | 8/1995 | Young et al. |
| 5,451,912 A | | 9/1995 | Torode |
| 5,473,285 A | | 12/1995 | Nuckolls et al. |
| 5,481,179 A | | 1/1996 | Keeth |
| 5,495,205 A | | 2/1996 | Parker et al. |
| 5,506,875 A | | 4/1996 | Nuckolls et al. |
| 5,511,100 A | | 4/1996 | Lundberg et al. |
| 5,525,933 A | | 6/1996 | Matsuki et al. |
| 5,546,433 A | | 8/1996 | Tran et al. |
| 5,552,748 A | | 9/1996 | O'Shaughnessy |
| 5,554,942 A | | 9/1996 | Herr et al. |
| 5,559,502 A | | 9/1996 | Schutte |
| 5,563,553 A | | 10/1996 | Jackson |
| 5,565,819 A | | 10/1996 | Cooper |
| 5,583,501 A | | 12/1996 | Henrion et al. |
| 5,589,783 A | | 12/1996 | McClure |
| 5,594,612 A | | 1/1997 | Henrion |
| 5,604,466 A | | 2/1997 | Dreps et al. |
| 5,608,770 A | | 3/1997 | Noguchi et al. |
| 5,610,550 A | | 3/1997 | Furutani |
| 5,610,955 A | | 3/1997 | Bland |
| 5,614,869 A | | 3/1997 | Bland |
| 5,644,254 A | | 7/1997 | Boudry |
| 5,666,118 A | | 9/1997 | Gersbach |
| 5,668,506 A | | 9/1997 | Watanabe et al. |
| 5,670,915 A | | 9/1997 | Cooper et al. |
| 5,673,004 A | | 9/1997 | Park |
| 5,675,813 A | | 10/1997 | Holmdahl |
| 5,682,049 A | | 10/1997 | Nguyen |
| 5,684,434 A | | 11/1997 | Mann et al. |
| 5,686,863 A | | 11/1997 | Whiteside |
| 5,689,196 A | | 11/1997 | Schutte |
| 5,699,024 A | | 12/1997 | Manlove et al. |
| 5,703,537 A | | 12/1997 | Bland et al. |
| 5,703,540 A | | 12/1997 | Gazda et al. |
| 5,726,597 A | | 3/1998 | Petty et al. |
| 5,729,165 A | | 3/1998 | Lou et al. |
| 5,796,312 A | | 8/1998 | Hull et al. |
| 5,805,909 A | | 9/1998 | Diewald |
| 5,818,370 A | | 10/1998 | Sooch et al. |
| 5,825,317 A | | 10/1998 | Anderson et al. |
| 5,845,151 A | * | 12/1998 | Story et al. |
| 5,870,004 A | | 2/1999 | Lu |
| 5,870,345 A | | 2/1999 | Stecker |
| 5,872,464 A | | 2/1999 | Gradinariu |
| 5,877,656 A | | 3/1999 | Mann et al. |
| 5,898,345 A | | 4/1999 | Namura et al. |
| 5,949,408 A | | 9/1999 | Kang et al. |
| 6,040,707 A | * | 3/2000 | Young et al. ............... 327/111 |
| 6,157,266 A | | 12/2000 | Tsai et al. |
| 6,191,660 B1 | | 2/2001 | Mar et al. |
| 6,199,969 B1 | | 3/2001 | Haflinger et al. |
| 6,211,739 B1 | | 4/2001 | Snyder et al. |
| 6,215,835 B1 | | 4/2001 | Kyles |
| 6,219,736 B1 | * | 4/2001 | Klingman |
| 6,225,992 B1 | | 5/2001 | Hsu et al. |
| 6,266,715 B1 | | 7/2001 | Loyer et al. |
| 6,294,962 B1 | | 9/2001 | Mar |
| 6,297,705 B1 | | 10/2001 | Williams et al. |
| 6,357,011 B2 | * | 3/2002 | Gilbert |
| 6,407,641 B1 | * | 6/2002 | Williams et al. |
| 6,433,645 B1 | | 8/2002 | Mann et al. |
| 6,466,036 B1 | | 10/2002 | Philipp |
| 6,515,551 B1 | | 2/2003 | Mar et al. |
| 6,525,616 B1 | | 2/2003 | Williams et al. |
| 6,646,514 B2 | | 11/2003 | Sutliff et al. |
| 6,708,233 B1 | | 3/2004 | Fuller et al. |
| 6,708,247 B1 | | 3/2004 | Barret et al. |
| 6,742,076 B2 | | 5/2004 | Wang et al. |
| 6,753,739 B1 | | 6/2004 | Mar et al. |
| 6,807,109 B2 | * | 10/2004 | Tomishima ............... 365/189.05 |
| 6,922,063 B2 | | 7/2005 | Heger |
| 6,946,920 B1 | | 9/2005 | Williams et al. |
| 6,960,953 B2 | | 11/2005 | Ichihara |
| 6,961,665 B2 | | 11/2005 | Slezak |
| 7,170,257 B2 | | 1/2007 | Oh |
| 7,212,183 B2 | | 5/2007 | Tobita |
| 7,276,977 B2 | | 10/2007 | Self |
| 7,375,593 B2 | | 5/2008 | Self |
| 7,439,777 B2 | | 10/2008 | Wood |
| 7,446,747 B2 | | 11/2008 | Youngblood et al. |
| 7,600,156 B2 | | 10/2009 | Thornley et al. |
| 7,631,111 B2 | | 12/2009 | Monks et al. |
| 2003/0122734 A1 | | 7/2003 | Chien et al. |
| 2004/0070559 A1 | | 4/2004 | Liang |
| 2004/0189573 A1 | | 9/2004 | Lee et al. |
| 2006/0033474 A1 | | 2/2006 | Shum |
| 2006/0244739 A1 | | 11/2006 | Tsai |
| 2007/0029975 A1 | | 2/2007 | Martin et al. |
| 2008/0258740 A1 | | 10/2008 | Wright et al. |
| 2008/0258797 A1 | | 10/2008 | Wright et al. |
| 2008/0259017 A1 | | 10/2008 | Wright et al. |
| 2008/0259065 A1 | | 10/2008 | Wright et al. |
| 2008/0259070 A1 | | 10/2008 | Snyder et al. |
| 2008/0263243 A1 | | 10/2008 | Wright et al. |
| 2008/0263260 A1 | | 10/2008 | Snyder et al. |

FOREIGN PATENT DOCUMENTS

| | | |
|---|---|---|
| JP | 287113 A1 | 11/1988 |
| JP | 291161 A1 | 11/1990 |
| JP | 297223 A1 | 12/1991 |
| WO | WO 89/06456 A1 | 7/1989 |
| WO | PCT/US96/17305 A1 | 6/1996 |
| WO | WO 97/36230 A1 | 10/1997 |
| WO | PCT/US98/34376 A1 | 8/1998 |
| WO | PCT/US99/09712 A1 | 2/1999 |

OTHER PUBLICATIONS

U.S. Appl. No. 11/965,520: "Active Liquid Crystal Display Drivers and Duty Cycle Operation," Snyder et al., filed on Dec. 27, 2007; 15 pages.

International Search Report for International Application PCT/US08/60699 mailed May 18, 2009; 2 pages.

The Written Opinion of the International Searching Authority for International Application PCT/US08/60699 mailed Jun. 18, 2009; 4 pages.

U.S. Appl. No. 11/864,137: "Configurable Liquid Crystal Display Driver System," Wright et al., filed on Sep. 28, 2007; 12 pages.

U.S. Appl. No. 11/855,281: "Reducing Power Consumption in a Liquid Crystal Display," Wright et al., filed on Sep. 14, 2007; 13 pages.

USPTO Notice of Allowance for U.S. Appl. No. 09/275,336, dated Sep. 27, 2000; 1 page.
USPTO Non-Final Rejection for U.S. Appl. No. 10/339,115, dated Oct. 2, 2003; 3 pages.
USPTO Non-Final Rejection for U.S. Appl. No. 10/339,115, dated Jan. 28, 2004; 4 pages.
USPTO Final Rejection for U.S. Appl. No. 10/339,115, dated Jun. 24, 2004; 5 pages.
U.S. Appl. No. 11/768,677: "Self-Calibrating Driver for Charging a Capacitive Load to a Desired Voltage," Wright et al., filed on Jun. 26, 2007; 10 pages.
USPTO Non-Final Rejection for U.S. Appl. No. 11/768,677, dated Jan. 6, 2010; 11 pages.
USPTO Final Rejection for U.S. Appl. No. 11/768,677 dated Jul. 27, 2009; 12 pages.
USPTO Non-Final Rejection for U.S. Appl. No. 11/768,677 dated Feb. 9, 2009: 10 pages.
U.S. Appl. No. 11/965,485: "Display Interface Buffer," Snyder et al., filed on Dec. 27, 2007; 16 pages.
U.S. Appl. No. 11/857,970: "Specialized Universal Serial Bus Controller," Wright et al., filed on Sep. 19, 2007; 12 pages.
USPTO Non-Final Rejection for U.S. Appl. No. 11/857,970 Mar. 10, 2010; 26 pages.
USPTO Final Rejection for U.S. Appl. No. 11/857,970 dated Aug. 19, 2009; 22 pages.
USPTO Non-Final Rejection for U.S. Appl. No. 11/857,970 dated Mar. 18, 2009; 21 pages.
International Search Report for International Application PCT/US08/60702 mailed Sep. 3, 2008; 2 pages.
The Written Opinion of the International Searching Authority for International Application PCT/US08/60702.
Jan Axelson, "USB Complete: Everything You Need to Develop USB Peripherals," 3rd Edition, Copyright 1999-2005, ISBN 978-1-931448-03-1, pp. 51-59, 85-91, 225; 20 pages.
USPTO Notice of Allowance for U.S. Appl. No. 09/511,019 dated Jan. 4, 2002; 4 pages.
USPTO Final Rejection for U.S. Appl. No. 09/511,019 dated Nov. 29, 2001; 5 pages.
USPTO Non-Final Rejection for U.S. Appl. No. 09/511,019 dated May 4, 2001; 5 pages.
CY7C63722/23 CY7C63742143 enCoRe USB Combination Low-Speed USb & PS/2 Peripheral Controller, Cypress Semiconductor Corporation, Revised May 2000; 48 pages.
CY7C63221/31 enCoRe USB Low-Speed USB Peripheral Controller, Cypress Semiconductor Corporation, Revised May 2000; 40 pages
Sam Yinshang Sun, "An Analog PLL-Based Clock and Data Recovery Circuit with High input Jitter Tolerance," Reprinted from IEEE Journal of Solid-State Circuits, vol. SC-24, pp. 325-330, Apr. 1989, pp. 383-385; 4 pages.
Robert A. Blauschild, "WP 3.5: An Integrated Time Reference," ISSCC94/Session 3, Analog Techniques/Paper WP 3.5, Feb. 1994, pp. 56-58; 4 pages.
Beomsup et al., "A 30-MHz Hybrid Analog/Digital Clock Recovery Circuit in 2-um CMOS," IEEE Journal of Solid-State Circuits, vol. 25, No. 6, Dec. 1990, pp. 1385-1394; 10 pages.
Bakker et al., "Micropower CMOS Temperature Sensor with Digital Output," IEEE, Jul. 1996; 3 pages.
USPTO Notice of Allowance for U.S. Appl. No. 08/868,079 dated Nov. 14, 2000; 3 pages.
USPTO Final Rejection for U.S. Appl. No. 08/868,079 dated Sep. 20, 2000; 4 pages.
USPTO Non-Final Rejection for U.S. Appl. No. 08/868,079 dated Apr. 12, 2000; 6 pages.
USPTO Final Rejection for U.S. Appl. No. 08/868,079 dated Dec. 17, 1999; 7 pages
USPTO Non-Final Rejection for U.S. Appl. No. 08/868,079 dated Jul. 1, 1999; 6 pages.
USPTO Advisory Action for U.S. Appl. No. 08/868,079 dated Mar. 26, 1999; 2 pages.
USPTO Final Rejection for U.S. Appl. No. 08/868,079 dated Jan. 27, 1999; 7 pages.
USPTO Non-Final Rejection for U.S. Appl. No. 08/868,079 dated Jan. 22, 1998; 7 pages.
"Universal Serial Bus Specification," Revision 1.0, Chapter 7, Jan. 1996, pp. 111-143; 34 pages.
USPTO Notice of Allowance for U.S. Appl. No. 09/511,020 dated Jun. 2, 2001; 1 page.
USPTO Non-Final Rejection for U.S. Appl. No. 09/511,020 dated Nov. 28, 2000; 4 pages.
USPTO Notice of Allowance for U.S. Appl. No. 09/966,626 dated Oct. 10, 2002; 8 pages.
USPTO Final Rejection for U.S. Appl. No. 09/966,626 dated Jun. 26, 2002; 5 pages.
USPTO Non-Final Rejection for U.S. Appl. No. 09/966,626 dated Dec. 6, 2001; 6 pages.
USPTO Notice of Allowance for U.S. Appl. No. 10/339,115 dated Jan. 28, 2005; 6 pages.
USPTO Advisory Action for U.S. Appl. No. 10/339,115 dated Jul. 29, 2004; 3 pages.
USPTO Final Rejection for U.S. Appl. No. 09/275,336 dated Aug. 31, 2000; 5 pages.
USPTO Non-Final Rejection for U.S. Appl. No. 09/275,336 dated Apr. 21, 2000; 6 pages.
USPTO Notice of Allowance for U.S. Appl. No. 09/721,316 dated Sep. 23, 2002; 5 pages.
USPTO Final Rejection for U.S. Appl. No. 09/721,316 (dated May 3, 2002; 5 pages.
USPTO Non-Final Rejection for U.S. Appl. No. 09/721,316 dated Aug. 7, 2001; 3 pages.
USPTO Non-Final Rejection for U.S. Appl. No. 09/721,316 dated Apr. 24, 2001; 4 pages.
USPTO Notice of Allowance for U.S. Appl. No. 10/342,455 dated Feb. 12, 2004; 4 pages.
USPTO Non-Final Rejection for U.S. Appl. No. 10/342,455 dated Nov. 6, 2003; 4 pages.
USPTO Non-Final Rejection for U.S. Appl. No. 10/342,455 dated Aug. 21, 2003; 4 pages.
USPTO Notice of Allowance for U.S. Appl. No. 09/207,912 dated May 7, 2001; 3 pages.
USPTO Non-Final Rejection for U.S. Appl. No. 09/207,912 dated Jan. 26, 2001; 4 pages.
USPTO Advisory Action for U.S. Appl. No. 09/207,912 dated Dec. 22, 2000; 1 page.
USPTO Final Rejection for U.S. Appl. No. 09/207,912 dated Oct. 11, 2000; 5 pages.
USPTO Non-Final Rejection for U.S. Appl. No. 09/207,912 dated Apr. 19, 2000; 5 pages.
USPTO Non-Final Rejection for U.S. Appl. No. 09/207,912 dated Nov. 10, 1999; 6 pages.
USPTO Notice of Allowance for U.S. Appl. No. 08/549,915 dated Apr. 8, 1997; 3 pages.
USPTO Non-Final Rejection for U.S. Appl. No. 08/549,915 dated May 24, 1996; 3 pages
USPTO Notice of Allowance for U.S. Appl. No. 08/696,008 dated Sep. 22, 1998; 4 pages.
USPTO Non-Final Rejection for U.S. Appl. No. 08/696,008 dated Apr. 6, 1998; 12 pages.
USPTO Non-Final Rejection for U.S. Appl. No. 08/696,008 dated Oct. 3, 1997; 3 pages.
USPTO Notice of Allowance for U.S. Appl. No. 08/865,342 dated Sep. 16, 1998; 1 page.
USPTO Non-Final Rejection for U.S. Appl. No. 08/865,342 dated Apr. 6, 1998; 5 pages.
USPTO Non-Final Rejection for U.S. Appl. No. 08/865,342 dated Feb. 3, 1998; 3 pages.
USPTO Notice of Allowance for U.S. Appl. No. 09/048,905 dated May 29, 2002; 4 pages.
USPTO Final Rejection for U.S. Appl. No. 09/048,905 dated Feb. 8, 2002; 6 pages.
USPTO Non-Final Rejection for U.S. Appl. No. 09/048,905 dated Feb. 8, 2002; 10 pages.
USPTO Non-Final Rejection for U.S. Appl. No. 09/048,905 dated Feb. 15, 2001; 12 pages.

USPTO Non-Final Rejection for U.S. Appl. No. 09/048,905 dated Aug. 22, 2000; 12 pages.
USPTO Final Rejection for U.S. Appl. No. 09/048,905 dated Oct. 15, 1999;8 pages.
USPTO Non-Final Rejection for U.S. Appl. No. 09/048,905 dated Jun. 3, 1999; 5 pages.
Cuppens et al., "An EEPROM for Microprocessors and Custom Logic," IEEE Journal of Solid-State Circuits, vol. SC-20, No. 2, Apr. 1985, pp. 603-608; 6 pages.
Electronic Engineering Times, "Ti's Quantum Leap," Issue 517, Dec. 19, 1988, pp. 1 and 86; 2 pages.
Kazerounian et al., "A Single Poly EPROM for Custom CMOS Logic Applications," IEEE 1986 Custom Integrated Circuits Conference, 1986, pp. 59-62; 4 pages.
Takebuchi at al , "A Novel Integration Technology of EEPROM Embedded CMOS Logic VLSI Suitable for ASIC Applications," IEEE 1992 Custom Integrated Circuits Conference, 1992, pp. 9.6.1-9.6.4; 4 pages.
Cacharelis et al., "A Modular 1 um CMOS Single Polysilicon EPROM PLD Technology," Aug. 1988 IEEE, pp. 60-IEDM 88 to 63-IEDM 88; 4 pages.
Ohsaki et al., "A Planar Type EEPROM Cell Structure by Standard CMOS Process and Applications," VLSI Technology, Digest of Technical Papers, May 1993, pp. 55-66; 2 pages.
Ohsaki et al., "A Planar Type EEPROM Cell Structure by Standard CMOS Process for Integration with Gate Array, Standard Cell, Microprocessor and for Neural Chips," IEEE 1993 Custom Integrated Circuits Conference, 1993; pp. 23.6.1-23.6.4; 4 pages.
Ohsaki at al., "SIPPOS (Single Poly Pure CMOS) EEPROM Embedded FPGA by News Ring Interconnection and Highway Path," IEEE 1994 Custom Integrated Circuits Conference, 1994, pp. 189-192; 4 pages.
Ohsaki et al,, "A Single Poly EEPROMCell Structure for Use in Standard CMOS Processes," IEEE Journal of Solid- State Circuits, vol. 29, No. 3, Mar. 1994, pp. 311-316; 6 pages.
Miyamoto et al., "An Experimental 5-V-Only 256-kbit CMOS EEPROM with a High-Performance Single-Polysilicon Cell," IEEE Journal of Solid State Circuits, vol. SC-21, No. 5, Oct. 1986, pp. 852-860; 9 pages.
Yoshikawa at al. "An EPROM Cell Structure for EPLD's Compatible with Single Poly-Si Gate Processes," IEEE Transactions on Electron Devices, vol. 37, No. 3, Mar. 1990, pp. 675-679; 5 pages.
USPTO Notice of Allowance for U.S. Appl. No. 08/259,323 dated Mar. 21, 1995; 1 page.
USPTO Non-Final Rejection for U.S. Appl. No. 08/259,323 dated Oct. 6, 1994; 7 pages.
T.J. Giles, "A University Frequency Synthesizer IC," Aug. 1979, Philips Telecommunication Review, vol. 37, No. 3, pp. 177-181; 6 pages.
Cypress Semiconductor Marketing Brochure, "Timing Technology Products," Published Nov. 1993, a publication of Cypress Semiconductor in San Jose, CA, pp. 5-7; 5 pages.
Hoe et al., "Cell and Circuit Design for Single-Poly EPROM," IEEE Journal of Solid-State Circuits, vol. 24, No. 4, Aug. 1989, pp. 1153-1157; 5 pages.
L. Richard Carley, "Trimming Analog Circuits Using Floating-Gate Analog MOS Memory," IEEE Journal of Solid-State Circuits, vol. 24, No. 6, Dec. 1989, pp. 1569-1575; 7 pages.
Frake et al., "A 9ns, Low Standby Power CMOS PLD with a Single-Poly EPROM Cell," 1989 IEEE International Solid- State Circuits Conference, Feb. 17, 1989, pp. 230-231 and 346; 3 pages.
Sugino et al., "Analysis of Writing and Erasing Procedure of Flotox Eeprom Using the New Charge Balance Condition (CBC) Model," NUPAD IV, May and Jun. 1992, pp. 65-69; 5 pages.
S.M. Sze, "Physics of Semiconductor Devices," 2nd Edition, John Wiley & Sons, New York, 1981, pp. 496-506; 13 pages.
Cacharelis et al., "A Fully Modular 1 urn CMOS Technology Incorporating EEPROM, EPROM and Interpoly Capacitors," 20th European Solid State Device Research Conference, Nottingham, Sep. 1990, pp. 547-550; 4 pages.
USPTO Non-Final Rejection for U.S. Appl. No. 11/864,137 dated Jul. 7, 2010; 9 pages.
USPTO Non-Final Rejection for U.S. Appl. No. 11/855,281 dated Jul. 1, 2010; 10 pages.
USPTO Notice of Allowance for U.S. Appl. No. 11/768,677 dated Jul. 1, 2010; 7 pages.
USPTO Final Rejection for U.S. Appl. No. 11/857,970 dated Sep. 1, 2010; 29 pages.
USPTO Non-Final Rejection for U.S. Appl. No. 11/965,520 dated Sep. 29, 2010; 11 pages.
USPTO Final Rejection for U.S. Appl. No. 11/965,520 dated Jun. 8, 2011; 14 pages.
USPTO Non-Final Rejection for U.S. Appl. No. 11/864,137 dated Jul. 7, 2010; 9 pages.
USPTO Non-Final Rejection for U.S. Appl. No. 11/864,137 dated Oct. 29, 2010; 10 pages.
USPTO Final Rejection for U.S. Appl. No. 11/864,137 dated Apr. 12, 2011; 12 pages.
USPTO Advisory Action for U.S. Appl. No. 11/855,281 dated Mar. 30, 2011; 4 pages.
USPTO Final Rejection for U.S. Appl. No. 11/855,281 dated Dec. 16, 2010; 13 pages.
USPTO Non-Final Rejection for U.S. Appl. No. 11/855,281 dated Jul. 1, 2010; 10 pages.
U.S. Appl. No. 13/100,876: "Load Driver," Wright et al., Filed on May 4, 2011; 20 pages.
USPTO Notice of Allowance for U.S. Appl. No. 11/768,677 dated Jul. 1, 2010; 7 pages.
USPTO Notice of Allowance for U.S. Appl. No. 11/768,677 dated Nov. 9, 2010; 8 pages.
USPTO Notice of Allowance for U.S. Appl. No. 11/768,677 dated Feb. 18, 2011; 9 pages.
USPTO Notice of Allowance for U.S. Appl. No. 11/768,677 dated Jun. 9, 2011; 9 pages.
USPTO Non-Final Rejection for U.S. Appl. No. 11/965,485 dated Oct. 1, 2010; 12 pages.
USPTO Final Rejection for U.S. Appl.No. 11/965,485 dated Apr. 13, 2011; 15 pages.
USPTO Advisory Action for U.S. Appl. No. 11/965,485 dated Jun. 14, 2011; 3 pages.
USPTO Final Rejection for U.S. Appl. No. 11/857,970 dated Sep. 1, 2010; 29 pages.
USPTO Final Rejection for U.S. Appl. No. 11/857,970 dated Oct. 22, 2010; 24 pages.
USPTO Advisory Action for U.S. Appl. No. 11/857,970 dated Jan. 6, 2011; 2 pages.
USPTO Non-Final Rejection for U.S. Appl. No. 11/857,970 dated Mar. 7, 2011; 32 pages.
USPTO Non-Final Rejection for U.S. Appl. No. 13/100,876 dated Dec. 7, 2011; 6 pages.

* cited by examiner

300

NON-RESISTIVE LOAD DRIVER

RELATED APPLICATIONS

This application claims the benefit of U.S. Provisional Application No. 60/912,577, filed Apr. 18, 2007, which is incorporated herein by reference.

TECHNICAL FIELD

The present disclosure relates generally to integrated circuits, and more particularly to a method and apparatus to drive non-resistive loads.

BACKGROUND

A conventional load driver circuit may include an operational amplifier (Op-Amp) and a Metal-Oxide-Semiconductor (MOS) power transistor. The MOS power transistor defines a current path from its drain to its source upon receiving an appropriate drive signal at its gate. The gate of the MOS power transistor may be connected to an output of the Op-Amp that includes an inverting input and a non-inverting input. The inverting input of the Op-Amp may be connected to the source of the MOS power transistor via a feedback path. A load may be connected to the source or the drain of the MOS power transistor.

This conventional load driver circuit works well for driving resistive loads. However, there are several limitations when using this circuit to drive non-resistive loads, including capacitive loads, e.g., a liquid crystal display (LCD) panel, and inductive loads. For example, the conventional load driver circuit may become less stable when driving a non-resistive load, which in turn makes it difficult to drive rail-to-rail voltages to an output of the conventional load driver circuit. Additionally, the conventional load driver circuit may be less resilient to load variations. Any load variation may cause the circuit to become less stable. One solution may be to include capacitors in the feedback path of the conventional load driver circuit. But this solution increases the number of components in the conventional load driver circuit, thus increasing cost.

DESCRIPTION OF EXAMPLE EMBODIMENTS

OVERVIEW

A device includes a voltage generator to generate an input voltage; a first circuit to drive a voltage associated with a load to a threshold voltage level; and a second circuit to adjust the voltage associated with the load to approximate the input voltage, and to compensate the voltage associated with the load, such that the voltage associated with the load is maintained at a substantially constant level. The device further includes a control logic having a control signal generator to generate signals to select between the first circuit and the second circuit.

A method includes providing an input voltage; driving a voltage associated with a load to a threshold level during a high-drive mode; adjusting the voltage associated with the load to approximate the input voltage during a low-drive mode; compensating the voltage associated with the load during the low-drive mode, such that the voltage associated with the load is maintained at a substantially constant level. The method further includes generating control signals to select between a high-drive mode and a low-drive mode.

BRIEF DESCRIPTION OF THE DRAWINGS

The foregoing and other objects, advantages and features will become more readily apparent by reference to the following detailed description in conjunction with the accompanying drawings.

DETAILED DESCRIPTION

Figure 1:
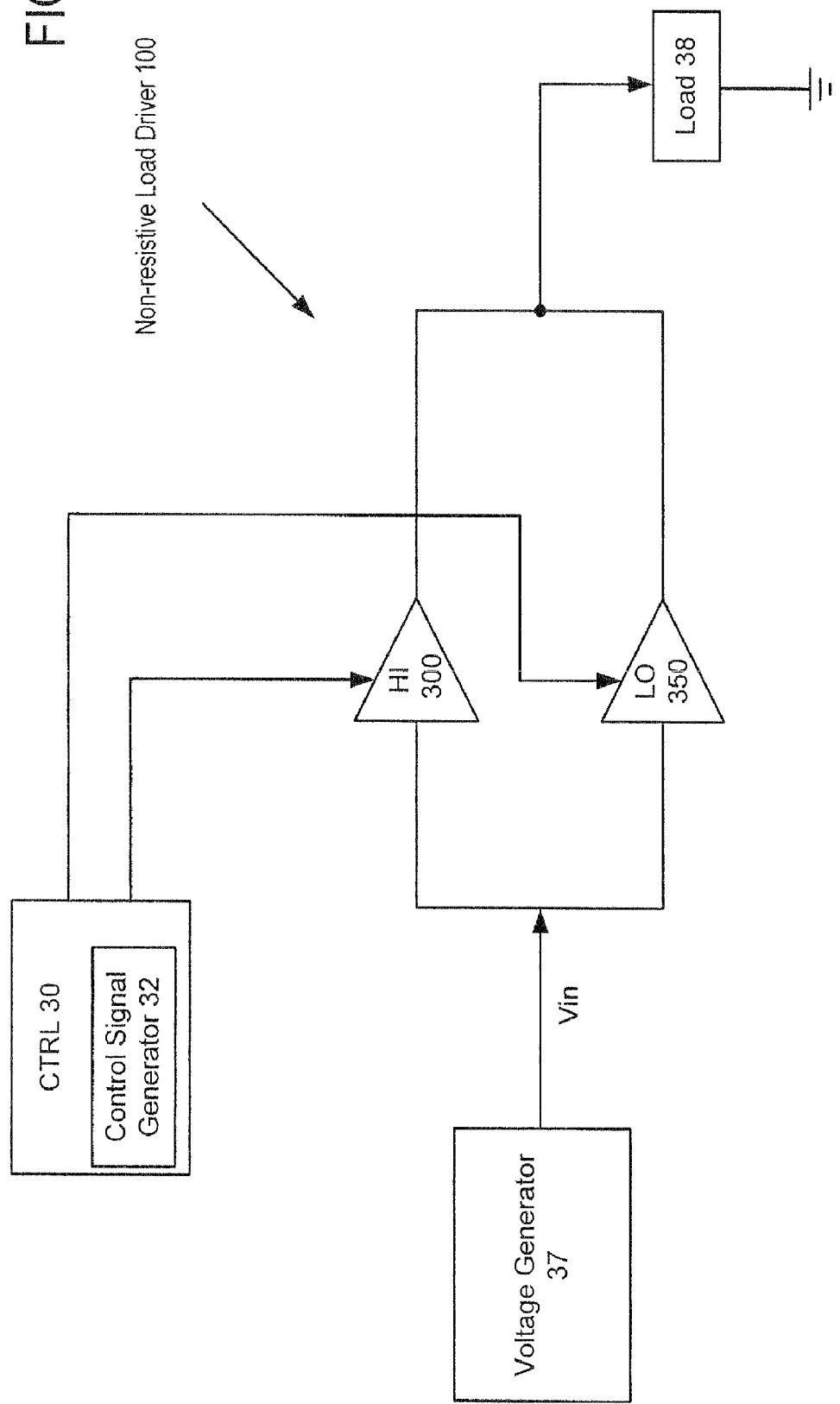
FIG. 1 is a schematic block diagram illustrating an example non-resistive load driver according to embodiments of the invention.

FIG. 1 is a schematic block diagram illustrating an example non-resistive load driver 100 according to embodiments of the invention. It should be recognized that FIG. 1 may include other elements, which are not illustrated in order to simplify the figures and which are not necessary to understand the example system disclosed below. The non-resistive load driver circuit 100 described and illustrated herein may be implemented in hardware, firmware, software, or any suitable combination thereof.

Referring to FIG. 1, the non-resistive load driver 100 may include a high-drive circuit 300 and a low-drive circuit 350 to drive rail-to-rail voltages at an output of the non-resistive load driver 100. The high-drive circuit 300 may actively drive a voltage level associated with the load 38 (i.e., output voltage of the non-resistive load driver 100) to a threshold voltage, while the low-drive circuit 350 may modify the voltage level associated with the load 38 to approximate an input voltage Vin, as well as compensate any leakage associated with the load 38 to maintain a stable voltage level at the load 38. Vin represents an input voltage to the non-resistive load driver 100. The input voltage Vin may be generated from a voltage generator 37. The control logic 30 includes a control signal generator 32 to generate appropriate control signals, to select either the high-drive circuit 300 or the low-drive circuit 350 to drive the load 38. The control logic 30 may also control the amount of time that each circuit 300 and 350 operates. The amount of time that each circuit 300 and 350 operates may be programmable for a dynamic switching between the circuits 300 and 350 or fixed depending on the load 38. The control logic 30 may also determine the appropriate operation mode for the non-resistive load driver 100 according to the voltage level associated with load 38. In some embodiments, the non-resistive load driver 100 may drive a capacitive load, such as a liquid crystal display (LCD) panel, an inductive load, or a partial-resistive load.

In some embodiments, the non-resistive load driver 100 may operate in a high-drive mode and a low-drive mode to drive rail-to-rail voltages at an output of the non-resistive load driver 100. The control logic 30 may determine the appropriate operation mode for the non-resistive load driver 100 according to the voltage level associated with load 38. During the high-drive mode, the high-drive circuit 300 may be selected to actively drive a voltage level associated with the load 38 to a threshold voltage level. The threshold voltage level may offset the input voltage Vin by a small amount. The threshold voltage level may be programmable or fixed. The non-resistive load driver 100 may switch to a low-drive mode in which the low-drive circuit 350 is activated. During the low-drive mode, the low-drive circuit 350 may modify the output voltage of the non-resistive load driver 100, i.e., voltage level associated with the load 38, to approximate the input voltage Vin. In addition, during the low-drive mode, the low-drive circuit 350 may compensate any leakage associated with the load 38 to maintain a constant voltage level at the load 38. In some embodiments, the low-drive mode may remain active during the high-drive mode to ensure a smooth transition from the high-drive mode to the low-drive mode. The low-drive circuit 350 consumes less current than the high-drive circuit 300, thereby reducing power consumption.

When driving an LCD panel, the non-resistive load driver 100 may cease to drive the LCD panel, or switch to a no-drive mode, after the output voltage of the non-resistive load driver 100 reaches a desired level. In the no-drive mode, both the high-drive circuit 300 and the low-drive circuit 350 may be turned off, thereby reducing power consumption. In addition, the voltage generator 37 may be turned-off to further reduce power consumption. When driving non-capacitive loads, such as inductive loads, the low-drive circuit 350 may remain turned on to ensure a smooth transition from the high-drive mode to the low-drive mode and to maintain an appropriate voltage level at the output of the non-resistive load driver 100.

The control logic 30 may provide appropriate control signals to the non-resistive load driver 100 to indicate which mode of operation, e.g., the high-drive mode, the low-drive mode, or the no-drive mode, may be used for driving a non-resistive load. The timing associated with each of these modes may be programmable for a dynamic switching between the modes or fixed depending on the voltage level at the load 38. In some embodiments, the non-resistive load driver 100 may be implemented using two or more discrete drivers, such as a high-drive circuit 300 and a low-drive circuit 350, while in other embodiments, the non-resistive load driver 100 may be implemented using a single driver with two or more operational modes controllable by a bias current.

In some embodiments, the low-drive circuit 350 may include an amplifier with chopper-offset cancellation technique that switches among input, output, and some internal nodes of the non-resistive load driver 100 to cancel out any offset voltages. A chopping frequency associated with the chopper-offset cancellation technique may be programmable when using the amplifier with chopper-offset cancellation technique to drive non-resistive loads.

The above-described non-resistive load driver 100 includes a high-drive circuit 300 and a low-drive circuit 350 that allows for rail-to-rail output voltage drive capability while maintaining a constant output voltage, when driving non-resistive loads. The non-resistive load driver 100 does not require additional capacitors to keep the circuit stable, thereby consuming less chip space. These external capacitors are typically required by the conventional load driver circuits to support large transient current flows. Additionally, the non-resistive load driver 100 consumes less power when driving non-resistive loads.

Figure 2:
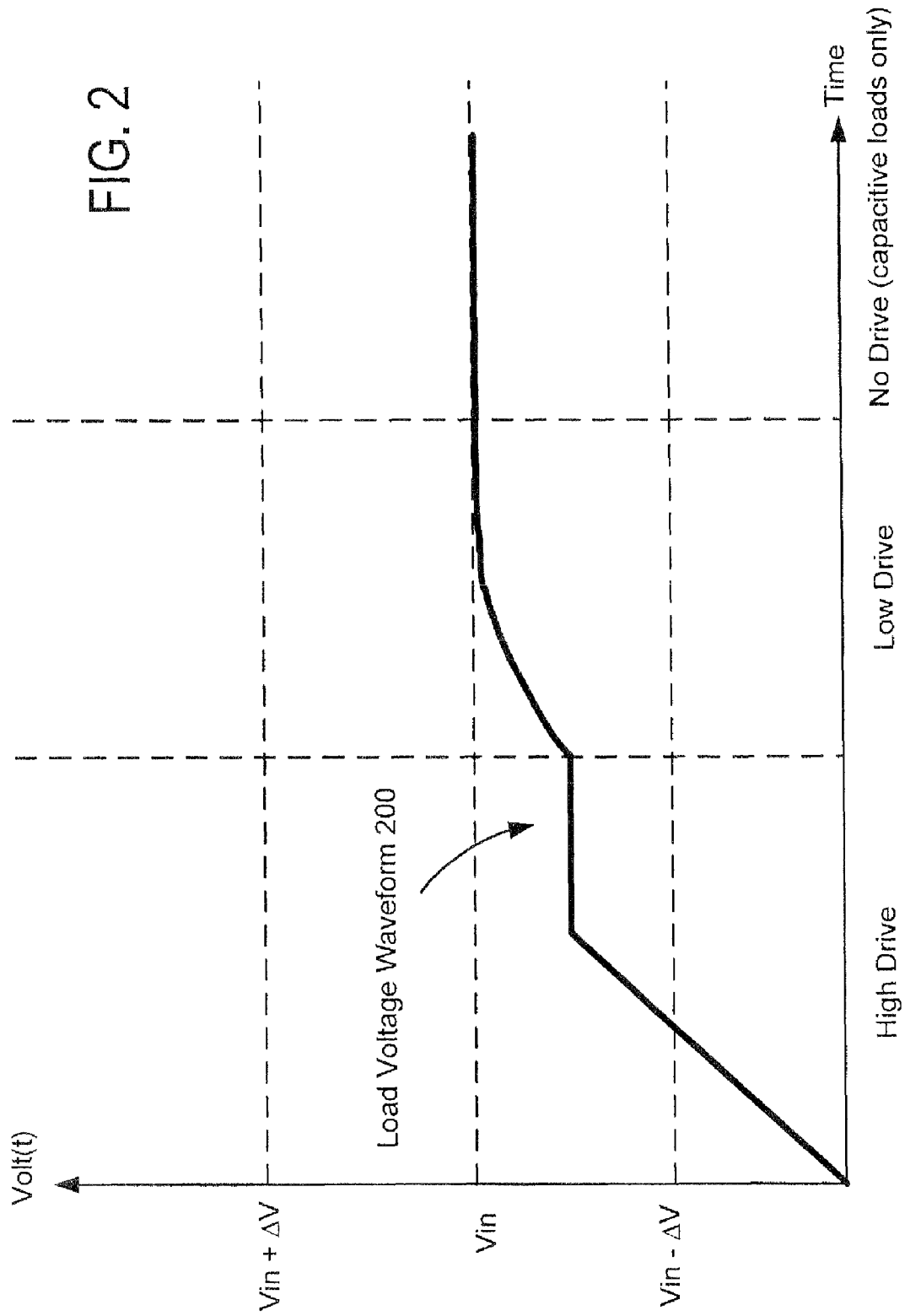
FIG. 2 is a diagram illustrating an example operation of the non-resistive load driver of FIG. 1 for an example load voltage waveform.

FIG. 2 is a diagram illustrating an example operation of the non-resistive load driver 100 of FIG. 1 for an example load voltage waveform 200. Referring to FIG. 2, the load voltage waveform 200 may represent instantaneous voltages associated with the load 38 as a function of time. Vin represents an input voltage to the non-resistive load driver 100. The input voltage Vin may be generated from the voltage generator 37 of FIG. 1. An offset voltage $\Delta V$ may be a relatively small voltage compared to the input voltage Vin. A voltage window (Vin−$\Delta V$, Vin+$\Delta V$) may be a voltage range to drive the output of the non-resistive load driver 100.

The non-resistive load driver 100 may operate in a high-drive mode such that the high-drive circuit 300 is selected to drive a load voltage to a value within the voltage window (Vin−$\Delta V$, Vin+$\Delta V$). The load voltage may offset the input voltage Vin by a small amount $\Delta V$. The non-resistive load driver 100 may also operate in a low-drive mode. In one embodiment, the high-drive circuit may automatically turn off itself after charging the load voltage to a certain threshold level, while the low-drive mode may be automatically and dynamically turned on/off to compensate and stabilize the load voltage, such that the load voltage is maintained substantially at a constant voltage level. During the low-drive mode, the low-drive circuit 350 is selected to modify the load voltage to approximate the input voltage Vin, such as by canceling any offset voltages associated with the load voltage. In addition, the low-drive circuit 350 may also compensate any leakage associated with the load 38 to provide a constant output voltage. The low-drive circuit 350 consumes less current than the high-drive circuit 300, thus reducing power consumption. When driving capacitive loads, the non-resistive load driver 100 may switch to a no-drive mode after the load voltage reaches a desired level. During the no-drive mode, the high-drive circuit 300, the low-drive circuit 350, and the voltage generator 37, may be turned off to reduce power consumption.

Figure 3:
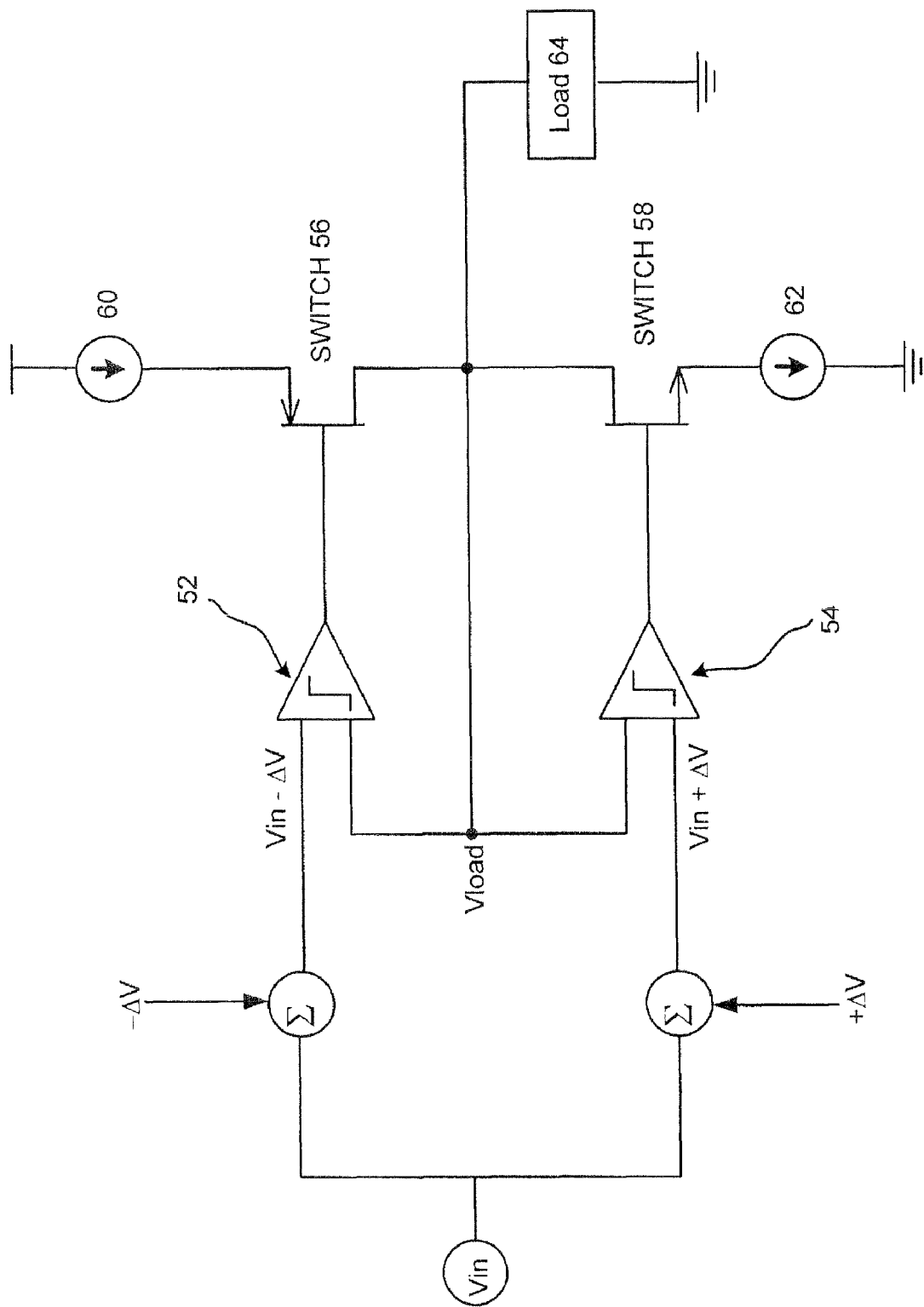
FIG. 3 is a schematic block diagram illustrating an example high-drive circuit of the non-resistive load driver of FIG. 1.

FIG. 3 is a schematic block diagram illustrating an example high-drive circuit 300 of the non-resistive load driver 100 of FIG. 1. Referring to FIG. 3, the example high-drive circuit 300 may include comparators 52 and 54, switches 56 and 58, current sources 60 and 62, to drive a load 64. Comparators 52 and 54 compare multiple voltages or currents and switch their respective output to indicate which voltage or current is larger. The output of comparators 52 and 54 controls switches 56 and 58, respectively. In some embodiments, the switch 56 may be an PMOS, whereas the switch 58 may be an NMOS. In other embodiments, the switches 56 and 58 may be any other device capable of performing the functions described herein.

Vin represents an input voltage to the high-drive circuit 300. The input voltage Vin may be generated from the voltage generator 37 of FIG. 1. An offset voltage $\Delta V$ may be a relatively small voltage compared to the input voltage Vin. A voltage window (Vin−$\Delta V$, Vin+$\Delta V$) may be a voltage range to drive the output of the high-drive circuit 300. The voltage window (Vin−$\Delta V$, Vin+$\Delta V$) may be programmable or fixed. A load voltage Vload may represent instantaneous voltages associated with the load 64 as a function of time.

The comparator 52 compares the value of the input voltage minus the offset voltage or Vin−$\Delta V$ with the load voltage Vload. In some embodiments, the comparator 52 outputs a "1" when Vin−$\Delta V$ is less than the load voltage Vload, thus directing the switch 56 to be turned off. Otherwise, the comparator 52 outputs a "0" when Vin−$\Delta V$ is greater than the load voltage Vload, thus directing the switch 56 to be turned on.

The Comparator 54 compares the value of the input voltage plus the offset voltage or Vin+$\Delta V$ with the load voltage Vload. When the load voltage Vload is less than Vin+$\Delta V$, the switch 58 is turned off. Otherwise, when the load voltage Vload is greater than Vin+$\Delta V$, the switch 58 is turned on.

When the switch 56 is on and the switch 58 is off, a large bias current may flow from the current source 60 to the load 64 to charge the load 64 until the load voltage Vload reaches a value within the window (Vin−$\Delta V$, Vin+$\Delta V$). Once the load voltage Vload is charged to a value within the window (Vin−$\Delta V$, Vin+$\Delta V$), both switches 56 and 58 may be off. When both switches 56 and 58 are off, the high-drive circuit 300 may be turned off to cease to drive the load 64. The low-drive circuit 350 may then be activated to modify or adjust the load voltage Vload to approximate the input voltage Vin and to compensate any leakage associated to the load 64 and to stabilize the load voltage Vload at a substantially constant level.

On the other hand, when the switch 56 is off and the switch 58 is on, a large bias current may flow from the load 64 to the current source 62 to discharge the load 64 until the load voltage Vload reaches a value within the window (Vin−ΔV, Vin+ΔV). Once the load voltage Vload is discharged to a value within the window (Vin−ΔV, Vin+ΔV), both switches 56 and 58 may be off. When both switches 56 and 58 are off, the high-drive circuit 300 may be turned off to cease to drive the load 64. The low-drive circuit 350 may then be activated to modify or adjust the load voltage Vload to approximate the input voltage Vin and to compensate any leakage associated to the load 64 and to stabilize the load voltage Vload at a substantially constant level.

Embodiments of the invention relate to a method and apparatus to drive non-resistive loads. The non-resistive load driver may include two or more drivers, such as a high-drive circuit 300 and a low-drive circuit 350, to drive rail-to-rail output voltages and to stabilize output voltages at a substantially constant level. The high-drive circuit may drive the output voltage of the non-resistive load driver to a threshold level, whereas the low-drive circuit may modify the output voltage of the non-resistive load driver to approximate an input voltage of the non-resistive load driver, and stabilize the output voltage of the non-resistive load driver at a substantially constant level. The low-drive circuit consumes less current than the high-drive circuit. The non-resistive load driver consumes less power and use less chip space. The non-resistive load driver may drive one of a capacitive load, an inductive load, or a partially-resistive load.

Further modifications and alternative embodiments of this invention will be apparent to those skilled in the art in view of this description. For example, the non-resistive load driver 100 may be implemented using a single driver with multiple modes, such as a low-drive mode and a high-drive mode, by changing a bias current of the non-resistive load driver 100 between a high current mode and a low current mode. Accordingly, this description is to be construed as illustrative only and is for the purpose of teaching those skilled in the art the manner of carrying out the invention. Various changes may be made in the shape, size and arrangement and types of components or devices. For example, equivalent elements or materials may be substituted for those illustrated and described herein, and certain features of the invention may be utilized independently of the use of other features, all as would be apparent to one skilled in the art after having the benefit of this description of the invention. Alternative embodiments are contemplated and are within the spirit and scope of the following claims.

The invention claimed is:

1. A device, comprising:
a voltage generator configured to generate an input voltage;
a first circuit configured to drive a non-resistive load to a threshold voltage level, the first circuit comprising;
 a first comparator configured to compare a non-resistive load voltage to a first voltage;
 a first switch configured to charge the non-resistive load when the first voltage is greater than the non-resistive load voltage;
 a second comparator configured to compare the non-resistive load voltage to a second voltage, and
 a second switch configured to discharge the non-resistive load when the non-resistive load voltage is greater than the second voltage; and
a second circuit configured to adjust the non-resistive load voltage to approximate the input voltage.

2. The device of claim 1, further comprising a control logic having a control signal generator configured to generate one or more signals to select the first circuit or the second circuit.

3. The device of claim 1, wherein the non-resistive load comprises at least one of a capacitive load, a partially resistive load, or an inductive load.

4. The device of claim 1, wherein the device is capable of operating in a high-drive mode to drive the non-resistive load to the threshold voltage level, and a low-drive mode capable of adjusting the non-resistive load voltage to approximate the input voltage, and to keep the non-resistive load voltage at a substantially constant level.

5. The device of claim 4, where the first circuit is associated with the high-drive mode and the second circuit is associated with the low-drive mode.

6. The device of claim 1, wherein the second circuit is configured to adjust the non-resistive load voltage by canceling an offset voltage associated with the non-resistive load.

7. The device of claim 4, wherein the device is capable of driving the non-resistive load to rail-to-rail voltages.

8. The device of claim 4, wherein the threshold voltage level is offset from the input voltage by a small amount.

9. The device of claim 1, wherein the threshold voltage level is between the first voltage and the second voltage, the first voltage is substantially a difference between the input voltage and an offset voltage, and the second voltage is substantially a sum of the input voltage and the offset voltage.

10. A method, comprising:
generating an input voltage;
driving a non-resistive load to a voltage within a voltage window, the voltage window being defined by the input voltage and an offset voltage during a high-drive mode;
adjusting a non-resistive load voltage to approximate the input voltage during a low-drive mode; and
compensating the non-resistive load voltage for leakage during the low-drive mode.

11. The method of claim 10, further comprising generating at least one control signal to select at least one of the high-drive mode or the low-drive mode.

12. The method of claim 10, wherein the driving a non-resistive load comprises driving at least one of a capacitive load, an inductive load, or a partially-resistive load.

13. The method of claim 10, further comprising driving the non-resistive load to rail-to-rail voltages.

14. The method of claim 11, further comprising changing a bias current between the high-drive mode and the low-drive mode, the low-drive mode consuming less current than the high-drive mode.

15. The method of claim 10, further comprising not driving the non-resistive load during a no-drive mode.

16. The method of claim 10, further comprising activating a first circuit to drive the non-resistive load to the voltage within the voltage window.

17. The method of claim 10, further comprising activating a second circuit to adjust the non-resistive load voltage to approximate the input voltage, and to compensate the non-resistive load voltage for leakage.

18. A non-resistive load driver, comprising:
a voltage generator configured to generate an input voltage;
a high drive circuit configured to drive a non-resistive load to a voltage within a voltage range, the voltage range being defined by the input voltage and an offset voltage;
a low drive circuit configured to adjust a non-resistive load voltage to approximate the input voltage by canceling any offset voltages associated with the non-resistive load voltage; and a control signal generator configured to generate one or more control signals to select at least one of the high-drive circuit or the low-drive circuit.

19. The non-resistive load driver of claim 18, further comprising at least one offset voltage generator configured to change at least one bias voltage when selecting the high-drive circuit or the low-drive circuit.

20. The non-resistive load driver of claim 18, wherein the voltage range is between a first voltage and a second voltage, the first voltage being a difference between the input voltage and the offset voltage, and the second voltage being a sum of the input voltage and the offset voltage.

* * * * *